United States Patent [19]

DeWinter et al.

[11] 4,072,544
[45] Feb. 7, 1978

[54] GROWTH OF III-V LAYERS CONTAINING ARSENIC, ANTIMONY AND PHOSPHORUS

[75] Inventors: John Christian DeWinter, Howell Township, Monmouth County; Robert Edward Nahory, Lincroft; Martin Alan Pollack, Westfield, all of N.J.

[73] Assignee: Bell Telephone Laboratories, Incorporated, Murray Hill, N.J.

[21] Appl. No.: 782,354

[22] Filed: Mar. 29, 1977

Related U.S. Application Data

[62] Division of Ser. No. 676,556, April 13, 1976, Pat. No. 4,032,951.

[51] Int. Cl.² .......................................... H01L 21/208
[52] U.S. Cl. .................................... 148/171; 148/172
[58] Field of Search ................... 148/171, 172; 357/16, 357/17, 18, 61

[56] References Cited

U.S. PATENT DOCUMENTS

| | | | |
|---|---|---|---|
| 3,224,913 | 12/1965 | Ruehrwein | 148/175 |
| 3,560,275 | 2/1971 | Kressel et al. | 148/171 |
| 3,614,549 | 10/1971 | Lorenz et al. | 148/177 |
| 3,677,836 | 7/1972 | Lorenz | 148/171 |
| 3,696,262 | 10/1972 | Antypas | 148/172 X |
| 3,721,583 | 3/1973 | Blakeslee | 148/175 X |
| 3,785,885 | 1/1974 | Stone | 148/172 |
| 3,821,033 | 6/1974 | Hu | 148/175 |
| 3,852,591 | 12/1974 | Lee | 350/96 WG |
| 3,933,538 | 1/1976 | Akai et al. | 148/173 X |
| 3,958,263 | 5/1976 | Panish et al. | 357/18 |

*Primary Examiner*—G. Ozaki
*Attorney, Agent, or Firm*—James F. Hollander

[57] ABSTRACT

Gallium arsenide antimonide phosphide (GaAsSbP) has beem successfully grown on a gallium arsenide substrate by liquid phase epitaxy. A critical amount of phosphorus initially in growth solution is depleted with consequent grading of lattice constant and bandgap in the epitaxially grown layer. The substrate and graded layer as a subassembly are well suited for use in electronic devices such as double heterostructure lasers, light-emitting diodes, Schottky barrier diodes, and p-n junction photodiodes in the near-infrared low loss region of optical fibers.

7 Claims, 17 Drawing Figures

GROWTH OF III-V LAYERS CONTAINING ARSENIC, ANTIMONY AND PHOSPHORUS

This is a division of application Ser. No. 676,556 filed Apr. 13, 1976 now U.S. Pat. No. 4,032,951.

BACKGROUND OF THE INVENTION

The present invention relates to electronic devices and methods for making them employing alloys of compounds having constituent elements in Group III and Group V of the periodic table.

The development of new and useful electronic devices in large part depends on the discovery of new materials and convenient and inexpensive methods of fabrication. One area in which research in electronic devices is presently proceeding apace is in optical communications technology. Transmission of information at high rates over beams of light conducted through low loss optical fibers offers practical and economic advantages compared to wire and radio transmission techniques.

An optical fiber link typically involves a light transmitter at one end of a light path and a light receiver at the other end. The light transmitter typically incorporates a light-emitting diode or a semiconductor laser for producing light in rapid response to an electrical signal bearing the information to be transmitted. The light receiver incorporates one of a variety of types of photodetector such as a Schottky diode or p-n junction semiconductor photodiode so that the incoming light is converted to an electrical signal again.

In such devices, materials having constituent elements in Group III and Group V of the periodic table, among which gallium arsenide is perhaps best known, have proven especially useful in the forming of crystalline layers. Depending on the wavelength of light to be used in the infrared or visible regions of the spectrum and the function of the device, the energy gap between the valence and conduction bands of the III–V material is designed to permit emission or absorption accordingly.

Gallium arsenide antimonide ($GaAs_{1-x}Sb_x$), which is a solid solution of the binary compounds gallium arsenide (GaAs) and gallium antimonide (GaSb), has an energy bandgap between about 0.9 micrometers and 1.7 micrometers of wavelength, depending on the relative proportions of the binaries. Since optical fibers exhibit low losses in this wavelength region and especially around 1.1 micrometers in the near-infrared, GaAsSb is exciting considerable interest for use in devices at the transmitting and receiving ends of optical fibers.

Unfortunately, however, it has proven difficult to grow GaAsSb on readily available substrates such as gallium arsenide so that the economic potential of GaAsSb can be realized in practical devices. The reason is that GaAsSb has a lattice constant different from substrates such as GaAs, introducing mechanical stresses and less than satisfactory crystal growth resulting in crystalline defects which shorten device operating lifetimes.

Heretofore, a thick layer of GaAsSb has been deposited on GaAs to reduce the effect of strain due to lattice mismatch between the substrate and subsequent grown layers, but the lattice mismatch with consequent disadvantageous effects remains. Another method has been to deposit a multiplicity of GaAsSb layers having differing compositions intermediate between the substrate and the active GaAsSb layer. Performance of devices is improved, but at the cost of complicating the crystal layer growth method and reducing the economic attractiveness of GaAsSb devices for optical communications applications.

SUMMARY OF THE INVENTION

According to a discovery herein disclosed, solid solution single crystal layers having the three Group V constituents, arsenic (As), antimony (Sb), and phosphorus (P), and at least one Group III constituent including gallium (Ga) are able to be repeatably produced on a solid layer or substrate material such as a Group III-Group V crystalline substrate such as GaAs by liquid phase epitaxy. As gallium arsenide antimonide phosphide (GaAsSbP) the grown layer is a mixed crystal, or crystalline intermixture of gallium antimonide (GaSb) and gallium phosphide (GaP) (together GaSbP) with gallium arsenide (GaAs).

Growth has been demonstrated by the liquid phase epitaxial (LPE) method, the fundamentals of which the art knows in other materials systems. Thus, the growth method is compatible with all-LPE growth of devices in a single process.

Not only can the solid solution III-V-V-V (GaAsSbP) crystal layer be of a critical composition lattice matched to an adjacent solid layer or substrate, but at the same time a highly useful subassembly is obtained having a microscopically smooth surface with a selectable lattice constant significantly different from the substrate. Unlike the prior art using GaAsSb layers, lattice matching is achieved, and achieved in a single LPE growth step, with GaAsSbP. The substrate-grown-layer subassembly is ideal for subsequent fabrication of a wide range of electronic devices including double heterostructure lasers, light-emitting diodes, Schottky barrier diodes, and p-n junction photodiodes. The solid solution layer may be doped $p$ or $n$ type. Grading of bandgap and lattice constant are observed in the solid solution layer, making possible simplified growth of lattice matching substrates for long-lived semiconductor lasers, and other devices, and a variety of unique graded-bandgap light emitting and detecting semiconductor device assemblies.

In the GaAsSbP solid solution layers of the graded type, the phosphorus component is found to be substantially depleted. The remaining GaAsSb at the surface of the grown layer has a bandgap in the near-infrared low loss wavelength region of optical fibers, so that devices according to the invention can answer the needs of contemplated fiber optic communication systems at both the light transmitting and receiving ends.

BRIEF DESCRIPTION OF THE DRAWINGS

FIGS. 3A, 3B and 3C are drawings representing enlarged microscopic views of the surface of coating layers resulting from the growth process of FIG. 1. FIG. 3B shows high quality lattice matched growth which is especially suitable for use in devices according to the invention.

DETAILED DESCRIPTION

Figure 1:
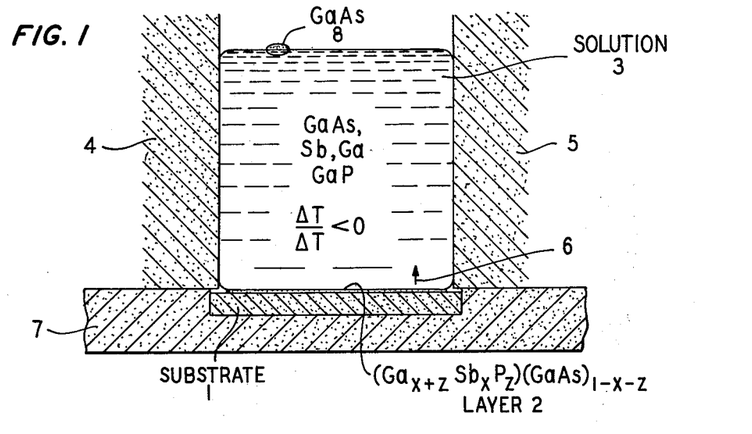
FIG. 1 is a cross section of an arrangement for growing a coating of (GaSbP) (GaAs) on a substrate from a growth solution applied in accordance with the invention.

FIG. 1 illustrates the method and structure of the present invention with simplicity. A heated substrate 1, suitably of GaAs having the (100) crystalline orientation, rests beneath and is covered by a heated solution 3 having a temperature sufficiently elevated, 700° to 950° C. being suitable, to be in the liquid phase. The solution 3 having a suitable composition of gallium, arsenic, antimony, and phosphorus illustratively is formed by dissolving selected amounts of GaAs, Sb, and GaP in liquid gallium and then the solution is applied to the substrate 1. An excess of GaAs remains undissolved as body 8. Substrate 1 rests in a recess in a holder 7, and solution 3 is confined by walls 4 and 5 which are preferably inert relative to the solution components. When the temperature is decreased at a relatively slow rate over a period of seconds or minutes, it is found that a solid solution or solid crystalline intermixture of Ga, As, Sb and P grows in the direction of arrow 6 on the surface of substrate 1 as a $(Ga_{x+z}Sb_xP_z)$ $(GaAs)_{1-x-z}$ coating layer 2. The unexpected miscibility of the Sb and P constituents in spite of a large difference of their atomic size makes possible a wide variety of useful applications to be described more fully below.

The substrate 1 coated with the GaAsSbP material 2 can form a subassembly which has a lattice constant at its exposed surface which is significantly different from the lattice constant of GaAs. The lattice constant at the exposed surface is chosen to be equal to the lattice constant of any additional layer which is to be grown in further electronic device fabrication.

An example will help to illustrate how the coating process can be determined in its details.

1. Solid Composition.

For the fabrication of electronic devices which emit or detect infrared wavelengths, the use of an additional layer of GaAsSb material having a band gap in the 1.1 micrometer low loss fiber optic wavelength range is promising. The solid composition of GaAsSb is determined by reference to a chart or graph of bandgap versus solid compostion, see for instance, FIG. 4 of G. A. Antypas et al., "Liquid Epitaxial Growth of GaAsSb and Its Use as a High-Efficiency Long-Wavelength Threshold Photoemitter", *Journal of Applied Physics,* Volume 41 No. 5, April, 1970, pages 2165-2171. The compositions of GaAsSb denoted $GaAs_{0.80}Sb_{0.20}$ and $GaAs_{0.90}Sb_{0.10}$ bound many of the compositions of interest in optical fiber applications in the near infrared. $GaAs_{0.87}Sb_{0.13}$ has a bandgap at about 1.04 micrometers.

2. Liquid Composition.

Then the liquid phase epitaxial growth solution which is in thermodynamic equilibrium with the composition $GaAs_{0.87}Sb_{0.13}$ is determined by reference to a GaAsSb ternary phase diagram or distribution curve such as FIGS. 1 and 3 of Antypas, or from equations to be described later. At a suitable temperature of 800° C., which was employed by the inventors, the equilibrium liquid has been found to have an atom fraction of Ga of 0.61, Sb of 0.37 and As of about 0.02. In other words, after GaAsSbP layer growth is completed by depletion of phosphorus in the example growth solution, $GaAs_{0.87}Sb_{0.13}$ can grow at 800° C. therefrom. It is to be noted, however, that GaAsSbP layer growth itself begins at a higher temperature, such as 825° C., when the temperature lowering method of liquid phase epitaxy is employed, and that the amount of phosphorus in the example growth solution is yet to be determined.

3. Substrate.

Next the substrate material is selected and a relationship involving the amount of phosphorus and antimony required in the grown coating 2 is taken into account. The lattice constant of the solid solution is assumed to be equal to the compositionally weighted average of the lattice constants of its components, a relationship known as Vegard's Rule. In mathematical terms the lattice constants $a_o$ for the components are related according to the equation $$a_o[GaAs_{1-x-z}Sb_xP_z] = (1-x-z)a_o[GaAs] + xa_o[GaSb] + za_o[GaP] \quad (1)$$

where $x$ and $z$ are independent GaSb and GaP mole fraction variables respectively and the lattice constants are tabulated as $$a_o[GaAs] = 5.65321 \text{ A} \quad (2A)$$

$$a_o[GaSb] = 6.09593 \text{ A} \quad (2B)$$

$$a_o[GaP] = 5.45117 \text{ A} \quad (2C)$$

in Table I of M. B. Panish and M Ilegems, "Phase Equilibria in Ternary III–V Systems", *Progress in Solid State Chemistry,* Volume 7, pages 39-83, H. Reiss and J. O. McCaldin, Editors, Pergamon Press, New York (1972).

To lattice match a general substrate, for example, the lattice constant of the substrate is set equal to that of the quaternary $$a_o[\text{substrate}] = a_o[\text{GaAs}_{1-x-z}\text{Sb}_x\text{P}_z] \qquad (3)$$

and substituted in Equation (1) which is then solved for the phosphorus to antimony compositional relationship required at the interface of the coating layer 2 and substrate 1. The result is $$z = \frac{a_o[\text{GaSb}] - a_o[\text{GaAs}]}{a_o[\text{GaAs}] - a_o[\text{GaP}]} x + \frac{a_o[\text{GaAs}] - a_o[\text{substrate}]}{a_o[\text{GaAs}] - a_o[\text{GaP}]} . \qquad (4)$$

If the substrate is GaAs, $$z = \frac{a_o[\text{GaSb}] - a_o[\text{GaAs}]}{a_o[\text{GaAs}] - a_o[\text{GaP}]} x = 2.19x. \qquad (5)$$

In words, the phosphorus concentration in the GaAsSbP solid solution must be 2.19 times the antimony concentration to lattice match gallium arsenide, assuming Vegard's Rule, the atomic fraction of gallium being one half. Another way of saying the same thing is that the mole fraction ratio of GaP to GaSb in the GaAsSbP solid solution of lattice match is 2.19.

If the substrate is indium phosphide (InP), for which the lattice constant $$a_o[\text{InP}] = 5.86875 \text{ A} \qquad (6)$$

(from Table I of Panish and Ilegems above-cited) then doing the arithmetic in equation (4) yields $$z = 2.19x - 1.07 \qquad (7)$$

In words, the phosphorus concentration in the GaAsSbP solid solution must be 2.19 times the antimony concentration less 1.07 to lattice match indium phosphide, assuming Vegard's Rule. Since the phosphorus content z cannot be negative, the antimony content x must exceed approximately 0.49 for a lattice matched GaAsSbP quaternary layer to be possible, however.

The GaAsSbP layer can also find use with other substrates or layers, including among the III-V crystalline materials, but not limited to, indium gallium arsenide (InGaAs), indium gallium arsenide phosphide (InGaAsP), gallium arsenide phosphide (GaAsP), gallium arsenide antimonide (GaAsSb), aluminum gallium arsenide (AlGaAs), aluminum gallium arsenide phosphide (AlGaAsP), aluminum gallium arsenide antimonide (AlGaAsSb), and compositions of itself (GaAsSbP).

Likewise other substrates, especially those having the zinc-blende crystal structure like the III-V compounds, can be suitable. The lattice constant of the substrate preferably is intermediate between the lattice constants of gallium phosphide and gallium antimonide. The lattice match calculation according to equation (4) proceeds analogously using the lattice constant of whatever substrate or layer is employed. When substrates or layers such as GaAsP, which has a lattice constant less than that of GaAs, are used, the sign of the trailing constant in equation (4) becomes positive, and z must exceed a value $$z = \frac{a_o[\text{GaAs}] - a_o[\text{substrate}]}{a_o[\text{GaAs}] - a_o[\text{GaP}]} \qquad (8)$$

4. Critical Phosphorus Atom Fraction $X_P^l$.

At this point the substrate, the Ga, As, and Sb atom fractions in the growth solution, and the Vegard's Rule x to z relationship are known. When growth is carried out, the substrate will be covered by a liquid solution including phosphorus as well as gallium, arsenic, and antimony at a temperature and composition such that the growth solution is in substantial equilibrium with a corresponding solid GaAsSbP which substantially lattice matches the substrate. The phosphorus atom fraction ($X_P^l$) in the growth solution may next be determined by experimentally growing coatings from trial solutions having different phosphorus atom fractions. However, this would be a most laborious process were it not for a mathematical predictive tool which the inventors have developed, herein disclosed. By the use of the following predictive equations the critical phosphorus atom fraction for achieving lattice match may be rather accurately determined over the whole range of growth temperatures and solutions from which GaAsSbP can be grown.

The mathematical predictive tool is given by the formally symmetric set of simultaneous thermodynamic equations in Equation Table I and by a set of constants for use therein given in Table II, and is related in part, but only in part, to analysis found in "Calculation of Ternary and Quaternary III-V Phase Diagrams," by G. B. Stringfellow, *Journal of Crystal Growth*, Volume 27, 1974, pages 21–34 and Panish and Ilegems, above-cited.

$\text{GaAs}_{1-x-z}\text{Sb}_x\text{P}_z$ EQUATION TABLE I

EQUILIBRIUM EQUATIONS

A)
$$\gamma_{GaAs}^s X_{GaAs}^s = \frac{4\gamma_{Ga}^l \gamma_{As}^l}{\gamma_{Ga}^{sl-GaAs} \gamma_{As}^{sl-GaAs}} X_{Ga}^l X_{As}^l \exp\left[\frac{\Delta S_{GaAs}^F}{RT}(T_{GaAs}^F - T)\right]$$

B)
$$\gamma_{GaSb}^s X_{GaSb}^s = \frac{4\gamma_{Ga}^l \gamma_{Sb}^l}{\gamma_{Ga}^{sl-GaSb} \gamma_{Sb}^{sl-GaSb}} X_{Ga}^l X_{Sb}^l \exp\left[\frac{\Delta S_{GaSb}^F}{RT}(T_{GaSb}^F - T)\right]$$

C)
$$\gamma_{GaP}^s X_{GaP}^s = \frac{4\gamma_{Ga}^l \gamma_{P}^l}{\gamma_{Ga}^{sl-GaP} \gamma_{P}^{sl-GaP}} X_{Ga}^l X_{P}^l \exp\left[\frac{\Delta S_{GaP}^F}{RT}(T_{GaP}^F - T)\right]$$

NORMALIZATION EQUATIONS AND CONSTRAINTS

D) $X_{Ga}^l + X_{As}^l + X_{Sb}^l + X_{P}^l = 1$    E) $X_{Ga}^l, X_{As}^l, X_{Sb}^l, X_{P}^l > 0$
(Liquid atom fractions of Ga, As, Sb and P.)

F) $X_{GaAs}^s + X_{GaSb}^s + X_{GaP}^s = 1$    G) $X_{GaAs}^s, X_{GaSb}^s, X_{GaP}^s > 0$
(Mole fractions of subscripted binaries in solid $\text{GaAs}_{1-x-z}\text{Sb}_x\text{P}_z$)

THERMODYNAMIC ACTIVITY COEFFICIENT EQUATIONS FOR SOLID

H) $RT \ln \gamma_{GaAs}^s = \beta_{GaAs-GaP}(X_{GaP}^s)^2 + \beta_{GaAs-GaSb}(X_{GaSb}^s)^2 + (\beta_{GaAs-GaP} + \beta_{GaAs-GaSb} - \beta_{GaSb-GaP}) X_{GaSb}^s X_{GaP}^s$ I) $RT \ln \gamma_{GaSb}^s = \beta_{GaSb-GaP}(X_{GaP}^s)^2 + \beta_{GaAs-GaSb}(X_{GaAs}^s)^2 + (\beta_{GaSb-GaP} + \beta_{GaAs-GaSb} - \beta_{GaAs-GaP}) X_{GaAs}^s X_{GaP}^s$ J) $RT \ln \gamma_{GaP}^s = \beta_{GaAs-GaP}(X_{GaAs}^s)^2 + \beta_{GaSb-GaP}(X_{GaSb}^s)^2$

THERMODYNAMIC ACTIVITY COEFFICIENT EQUATIONS FOR SOLID -continued $$+ (\beta\text{-GaAs-GaP} + \beta_{GaSb\text{-}GaP} - \beta_{GaAs\text{-}GaSb}) X_{GaAs}{}^s X_{GaSb}{}^s$$

THERMODYNAMIC ACTIVITY COEFFICIENT EQUATIONS FOR LIQUID

K) $RT \ln \gamma_{Ga}^l = \alpha_{Ga\text{-}As}(X_{As}^l)^2$
$+ \alpha_{Ga\text{-}Sb}(X_{Sb}^l)^2 + \alpha_{Ga\text{-}P}(X_P^l)^2$
$+ (\alpha_{Ga\text{-}As} + \alpha_{Ga\text{-}Sb} - \alpha_{As\text{-}Sb}) X_{As}^l X_{Sb}^l$
$+ (\alpha_{Ga\text{-}As} + \alpha_{Ga\text{-}P} - \alpha_{As\text{-}P}) X_{As}^l X_P^l$
$+ (\alpha_{Ga\text{-}Sb} + \alpha_{Ga\text{-}P} - \alpha_{Sb\text{-}P}) X_{Sb}^l X_P^l$ L) $RT \ln \gamma_{As}^l = \alpha_{Ga\text{-}As}(X_{Ga}^l)^2$
$+ \alpha_{As\text{-}Sb}(X_{Sb}^l)^2 + \alpha_{As\text{-}P}(X_P^l)^2$
$+ (\alpha_{Ga\text{-}As} + \alpha_{As\text{-}Sb} - \alpha_{Ga\text{-}Sb}) X_{Ga}^l X_{Sb}^l$
$+ (\alpha_{Ga\text{-}As} + \alpha_{As\text{-}P} - \alpha_{Ga\text{-}P}) X_{Ga}^l X_P^l$
$+ (\alpha_{As\text{-}Sb} + \alpha_{As\text{-}P} - \alpha_{Sb\text{-}P}) X_{Sb}^l X_P^l$ M) $RT \ln \gamma_{Sb}^l = \alpha_{Ga\text{-}Sb}(X_{Ga}^l)^2$
$+ \alpha_{As\text{-}Sb}(X_{As}^l)^2 + \alpha_{Sb\text{-}P}(X_P^l)^2$
$+ (\alpha_{Ga\text{-}Sb} + \alpha_{As\text{-}Sb} - \alpha_{Ga\text{-}As}) X_{Ga}^l X_{As}^l$
$+ (\alpha_{Ga\text{-}Sb} + \alpha_{Sb\text{-}P} - \alpha_{Ga\text{-}P}) X_{Ga}^l X_P^l$
$+ (\alpha_{As\text{-}Sb} + \alpha_{Sb\text{-}P} - \alpha_{As\text{-}P}) X_{As}^l X_P^l$ N) $RT \ln \gamma_P^l = \alpha_{Ga\text{-}P}(X_{Ga}^l)^2$
$+ \alpha_{As\text{-}P}(X_{As}^l)^2 + \alpha_{Sb\text{-}P}(X_{Sb}^l)^2$
$+ (\alpha_{Ga\text{-}P} + \alpha_{As\text{-}P} - \alpha_{Ga\text{-}As}) X_{Ga}^l X_{As}^l$
$+ (\alpha_{Ga\text{-}P} + \alpha_{Sb\text{-}P} - \alpha_{Ga\text{-}Sb}) X_{Ga}^l X_{Sb}^l$
$+ (\alpha_{As\text{-}P} + \alpha_{Sb\text{-}P} - \alpha_{As\text{-}Sb}) X_{As}^l X_{Sb}^l$

ACTIVITY COEFFICIENTS FOR STOICHIOMETRIC LIQUIDS

O) $\gamma_{Ga}^{sl\text{-}GaAs} = \exp(\alpha_{Ga\text{-}As}/4RT)$  P) $\gamma_{As}^{sl\text{-}GaAs} = \exp(\alpha_{Ga\text{-}As}/4RT)$
Q) $\gamma_{Ga}^{sl\text{-}GaSb} = \exp(\alpha_{Ga\text{-}Sb}/4RT)$  R) $\gamma_{Sb}^{sl\text{-}GaSb} = \exp(\alpha_{Ga\text{-}Sb}/4RT)$
S) $\gamma_{Ga}^{sl\text{-}GaP} = \exp(\alpha_{Ga\text{-}P}/4RT)$  T) $\gamma_P^{sl\text{-}GaP} = \exp(\alpha_{Ga\text{-}P}/4RT)$

TABLE II
TABLE OF CONSTANTS

| Subscripted Pair | Temperature of Fusion $T^F$(° K) | Entropy of Fusion $\Delta S^F$(cal/mole-° K) | Liquid Interaction Parameter $\alpha$ (cal/mole) | Solid Interaction Parameter $\beta$ (cal/mole) |
|---|---|---|---|---|
| Ga-As | 1511 | 16.64 | $-9.16T+5160$ | — |
| Ga-Sb | 983 | 15.80 | $-6.00T+4700$ | — |
| Ga-P | 1738 | 16.80 | $-4.80T+2800$ | — |
| As-Sb | — | — | $-1800+3300X_{Sb}^l$ | — |
| As-P | — | — | 1500 | — |
| Sb-P | — | — | 4600 | — |
| GaAs-GaP | — | — | — | 900 |
| GaAs-GaSb | — | — | — | 3550 |
| GaSb-GaP | — | — | — | 7900 |

T = solution temperature in ° K
R = 1.9817 cal/mole - ° K (gas constant)

To use the equations, the constants of Table II are inserted into the equations of the $GaAs_{1-x-z}Sb_xP_z$ Equation Table I. Then in the example of growing $GaAs_{0.87}Sb_{0.13}$ 1.04 micrometer wavelength devices on GaAs substrates, the initial GaAsSbP growth temperature T of 825° C. and the previously determined antimony atom fraction in the solution $X_{Sb}^l = 0.3700$ are also inserted in the equations. The lattice matching equation (4) and the Table I equations A) through T) are solved simultaneously (suitably by interations on a computer) for $X_{GaAs}^s$, $X_{GaSb}^s$, $X_{GaP}^s$, $X_{Ga}^l$, $X_{As}^l$, and $X_P^l$ to obtain a solid $GaAs_{1-x-z}Sb_xP_z$ for which $$x = X_{GaSb}^s \quad (9)$$

$$z = X_{GaP}^s \quad (10)$$

$$1-x-z = X_{GaAs}^s \quad (11)$$

which perfectly lattice matches the substrate. The mathematically determined $X_P^l$ is exactly the amount of phosphorus needed in the growth solution. It may, of course, be helpful to slightly adjust $X_P^l$ (phosphorus in the liquid) experimentally to achieve perfectly lattice matched growth in practice.

Figure 2:
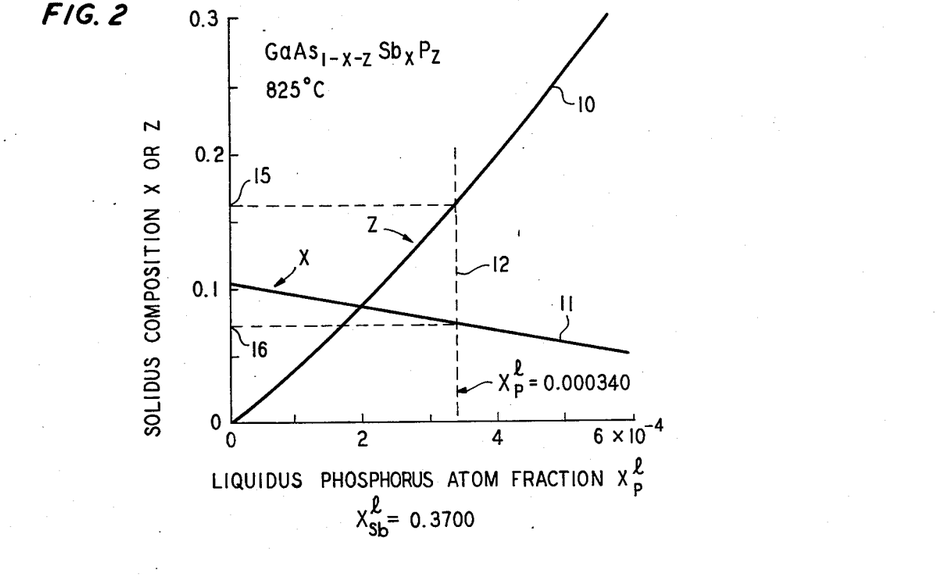
FIG. 2 is a phase diagram for GaAsSbP which relates the composition of the solid GaAsSbP which is in thermodynamic equilibrium with a corresponding liquid phase having a variable phosphorus fraction shown on the abscissa.

FIG. 2 illustrates a conceptual solution of the equations in simplified graphical phase diagram form. Equations A) through T) of Equation Table I have been solved simultaneously at 825° C. to yield values of $x = X_{GaSb}^s$ and $z = X_{GaP}^s$ for different values of $X_P^l$ at constant $X_{Sb}^l = 0.3700$. The solid solution values of $x$ (antimonide) and $z$ (phosphide) are plotted on the ordinate as curves 11 and 10 respectively against $X_P^l$ on the abscissa. Phosphide curve 10 slopes sharply upward from the origin with increased phosphorus in the liquid. Antimonide curve 11 more slowly decreases from a positive intercept around $x = 0.11$. ($X_{Ga}^l$ and $X_{As}^l$ turn out to be about 0.61 and 0.02 respectively in the mathematical solutions.) To complete the calculation of the critical $X_P^l$, the GaAs substrate lattice matching equation $z = 2.19x$ (equivalent to Equation 4) is taken into account. Insepection of the FIG. 2 phase diagram shows that the lattice matching equation is satisfied when $X_P^l = 0.000340$, $z = X_{GaP}^s = 0.165$ and $x = X_{GaSb}^s = 0.075$ as indicated by dotted line 12 and points 15 and 16 respectively.

It is to be emphasized that while a specific example has been described, the equations are applicable to growth of GaAsSbP at many temperatures and solution compositions thereby enabling the skilled worker to have convenient control of the whole GaAsSbP material system in its manifold compositional variations, now that the inventors have successfully demonstrated that GaAsSbP can in fact be grown as a solid solution.

The equations and data of Tables I and II are also of significant value for growth of GaAsSb in calculating the $X_{Ga}^l$, $X_{As}^l$, and $X_{Sb}^l$ for the liquid composition as suggested at step 2 hereinabove. A growth temperature T is selected, and the equations of Equation Table I are solved simultaneously for the liquid composition variables, given the Table II constants, $X_P^l = X_{GaP}^s = 0$, and the desired $X_{GaAs}^s$ and $X_{GaSb}^s$.

Figure 3A:
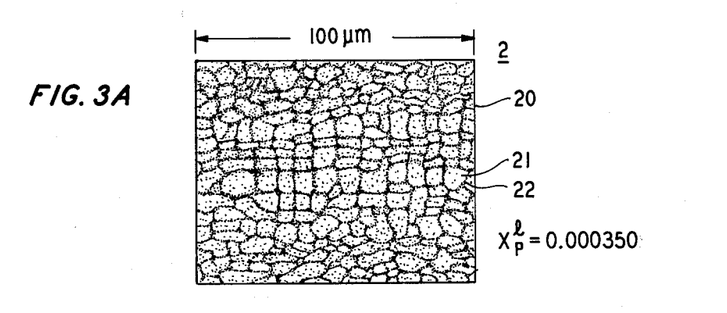
Figure 3B:
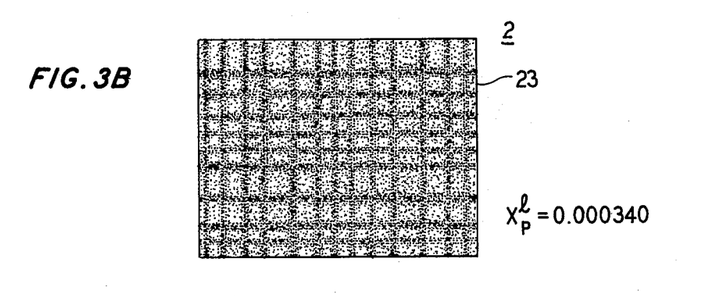
Figure 3C:
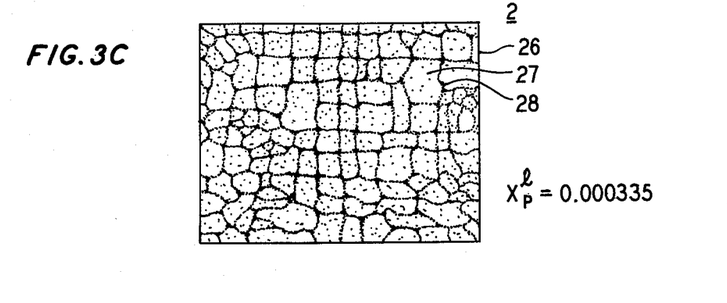

The quality and suitability of the GaAsSbP solid solution coating layer 2 for use in electronic devices is dependent on the precise composition of the coating, which should lattice match to the substrate 1 of FIG. 1. FIGS. 3A, 3B, and 3C, which are drawings adapted from Nomarski phase contrast microscope photomicrographs at 1000 times magnification, illustrate the importance of precise lattice matching. in FIG. 3A, with too much phosphorus content in the growth liquid, the surface 20 of coating layer 2 exhibits an aggregation of randomly located crystallites 21 separated by substantial grain boundaries 22.

FIG. 3A corresponds to an atom fraction $X_P^l$ of the phosphorus in the solution of 0.000350. However, when the phosphorus concentration $X_P^l$ is decreased to 0.000340, relatively smooth surfaced single-crystal growth of GaAsSbP mixed crystal occurs, as shown in FIG. 3B, and features no more than a regular rippling of the exposed surface 23 on the order of a fraction of a micron. It was the inventors observation of lattice matching at this critical $X_P^l$ after many laborious trials that enabled completion of the Table of Constants (Table II) so that accurate predictive control over the GaAsSbP materials system has now been made possible.

FIG. 3C, corresponding to a phosphorus concentration of 0.000335, again shows poor quality growth of surface 26 featuring large crystallites 27 and unsuitable grain boundaries 28.

In general, unsatisfactory growth results in a grown coating layer 2 which has an exposed surface that appears dull, rough or matte to the naked eye, while satisfactory growth according to the present invention presents a relatively shiny, polished surface appearance.

Experimental confirmation that compositional grading indeed occurs is obtained by growing a number of layers with different thicknesses, such as by growing through temperature ranges $\Delta T$, from 7.5 degrees to 40° C., starting at 820° C., and using the same initial liquid composition as for the layer of FIG. 3B. The composition $x, z$ of each layer near its surface is determined by electron microprobe analysis. For an introduction to this technique, see *Electron Probe Microanalysis* by L. S. Birks, Interscience Publishers, New York, 1963, pages 1-11. The results are shown in FIG. 4A as a function of the microscopically measured layer thickness.

The analyzed region, under the conditions of the microprobe measurement, extends from the surface to a depth of 2.5 micrometers. The fraction of GaSb in the solid, $x$, increases gradually with layer thickness while the fraction of GaP, $z$, decreases rapidly within the first few micrometers to a negligible concentration. The phosphorus distribution coefficient $k_P = z/(2X_P^l)$ is nearly constant, and equal to about 230. The value of the phosphorus concentration $z$ is then expected to decrease exponentially with layer thickness, or increasing distance from the GaAs layer surface, rapidly because of the large magnitude of $k_P$. This behavior is in agreement with the empirical curve of FIG. 4A. During this rapid decrease of $z$, the value of $x$ should increase rather gradually, which is also in agreement with the results of FIG. 4A. Thus, the process of grading takes place primarily by the replacement of phosphorus with arsenic, while the antimony content remains relatively unchanged. The points 15 and 16 in FIG. 4A for zero layer thickness are extrapolated from the data and agree with $x = 0.075$ and $z = 0.165$ from the phase diagram calculation described hereinabove in connection with FIG. 2.

It should be noted that the grading can be made relatively gradual by using a greater volume of growth solution at the same temperature, or a lower growth temperature to permit more phosphorus in the equilibrium solution at lattice match. Conversely, grading will be more pronounced due to more rapid phosphorus depletion when a solution of reduced volume or a higher growth temperature is employed.

Figure 4A:
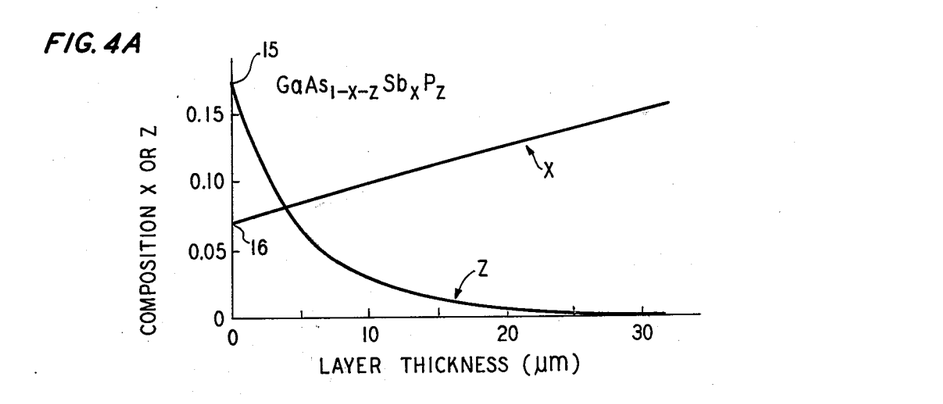
FIG. 4A is a graph of measured antimony and phosphorus compositions $x$ and $z$ of a graded coating layer of GaAsSbP as functions of thickness of the layer.
Figure 4B:
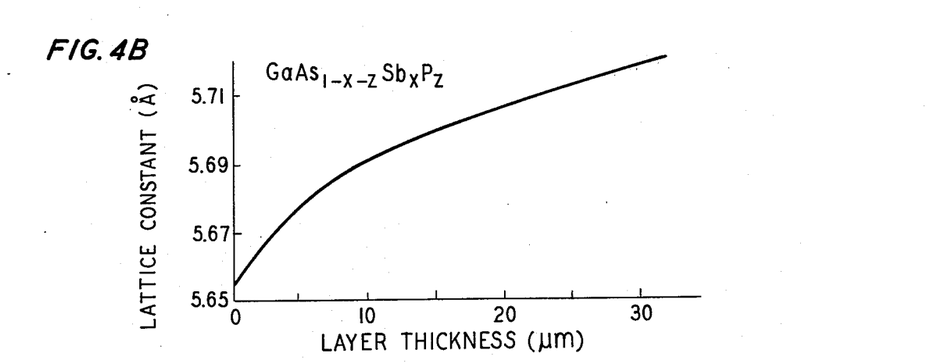
FIG. 4B is a graph of lattice constant versus layer thickness of a GaAsSbP graded layer grown according to the invention.

FIG. 4B shows how the lattice constant, calculated from FIG. 4A using Vegard's Rule, varies with layer thickness. Within the first 10 micrometers of growth the lattice constant is primarily determined by phosphorus depletion from the solution, whereas subsequently its variation is controlled by the thermodynamics of the Ga-As-Sb system. Thus, if temperature decrease or other liquid phase epitaxy is continued for enough time, a substantially pure layer of gallium arsenide antimonide is produced on a layer-part of GaAsSbP so that grading in lattice constant can conveniently continue to occur in the same growth step. The result is that the lattice constant shown in FIG. 4B rises from a value which substantially lattice matches GaAs to a higher value which lattice matches further layers such as gallium arsenide antimonide and aluminum gallium arsenide antimonide in electronic device fabrication.

Growth of layers according to the invention is theoretically possible between the melting point of gallium at approximately 30° C and the melting point of GaP at 1465° C but growth is most conveniently accomplished between 700 and 950° C, the region of 775° to 825° C having been used in the inventors' experiments.

When coatings of GaAsSbP are deposited lattice matched on GaAs substrates according to the method hereinabove described, a coated subassembly article of manufacture having an advantageously smooth surface for further layer deposition and subsequent semiconductor overgrowth is produced which can find a wide variety of applications in electronic devices incorporating the subassembly in manufacture. Some electronic devices according to the invention are described below. All of the devices include the subassembly as well as a third layer distinct in electrical characteristics from the GaAsSbP layer to achieve the device purposes.

Figure 5:
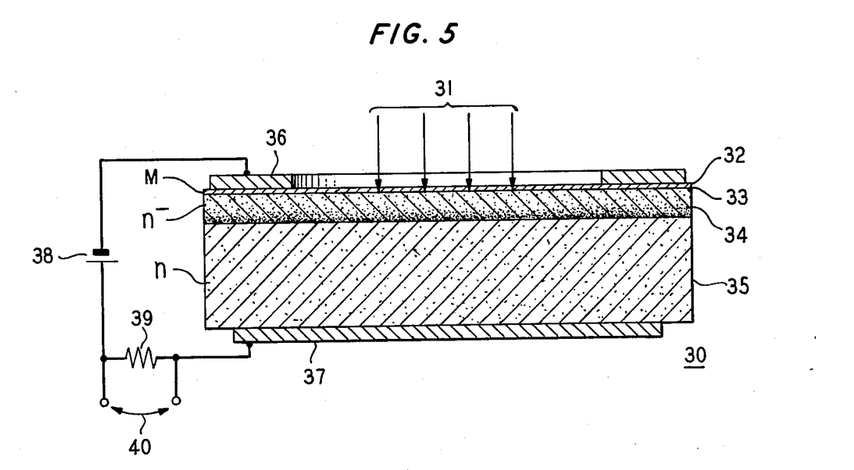
FIG. 5 shows a Schottky barrier diode according to the invention drawn in cross section with a schematic diagram of an accompanying electronic circuit.

FIG. 5 illustrates in cross section the construction and operation of a Schottky barrier diode photodetector 30 according to the invention. This photodiode device is constructed on readily available GaAs substrate material and is operative in the low loss nearinfrared wavelength range, 1.0 to 1.2 micrometers, of optical fibers. Near-infrared rays 31 impinge upon a metal-semiconductor interface 33 between a metal layer 32, suitably of evaporated palladium or electroplated platinum, and a near-infrared absorptive graded layer 34 of GaAsSbP grown according to the inventive method on a GaAs substrate 35.

The metal layer is deposited thick enough to be unbroken over the GaAsSbP layer 34 but thin enough to be essentially transparent to the rays 31, approximately a few hundred Angstroms being suitable. GaAsSbP layer 34 is undoped and exhibits a very small n-type carrier concentration over a thickness of approximately 10 microns. GaAs substrate 35 is suitably doped n-type with tin to a carrier concentration of approximately $10^{18}$ per cubic centimeter. Ohmic contact is provided by a standard tin-nickel-gold layer 37 on the n-type GaAs substrate 35. A discussion of contacting techniques for n-type GaAs is found in *Ohmic Contacts to Semiconductors*, B. Schwartz, Ed., pages 102-114, (1969). A standard gold contact ring 36 is plated or evaporated on the metal layer 32 by any suitable photoresist or other technique.

Schottky diode 30 operates in a reversed biased mode with a suitable voltage source 38 connected with a negative terminal to contact ring 36 and a positive terminal to electrode layer 37 via resistor 39. When near-infrared rays 31 impinge upon the metal-semiconductor junction 33, a voltage 40 is developed across resistor 39 due to the flow of photocurrent, which varies in rapid response to any optical communications modulation impressed on the rays 31.

Figure 6:
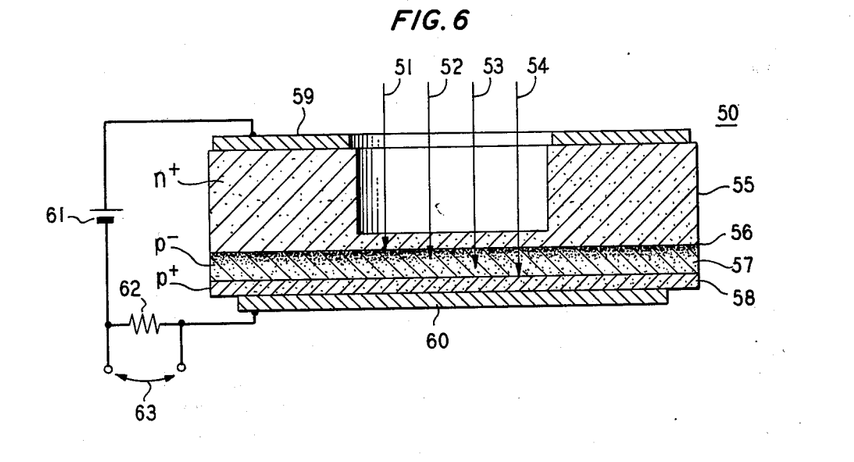
FIG. 6 shows a graded bandgap p-n junction photodiode utilizing GaAsSbP according to the invention drawn in cross section with a schematic diagram of an accompanying circuit.

FIG. 6 shows a form of p-n photodetector diode 50 employing a heterojunction of semiconductor materials including GaAsSbP which can reduce dispersion of transmitted pulses in an optical communications system at near-infrared wavelengths. Near-infrared optical rays 51, 52, 53 and 54 pass with low loss through GaAs substrate 55 which has been etched with 1-10 percent bromine in methanol to reduce the distance through which the light must pass. GaAs substrate 55 is suitably doped heavily n-type with tin to a carrier concentration of approximately $10^{18}$ carriers per cubic centimeter. A heterojunction 56 is formed by the GaAs with an approximately 10 micrometers thick, GaAsSbP graded bandgap layer 57, lightly p-doped with gremanium or zinc to $1-10 \times 10^{15}$ carriers per cubic centimter on which is deposited a heavily germanium-p-doped GaAsSb layer 58.

Electrode layer 60, suitably having sublayers of thin chrome and thick gold, is evaporated or electroplated by standard techniques to form an ohmic contact with the heavily p-dopd GaAsSb layer 58. See also, for instance, *Ohmic Contacts to Semiconductors*, pages 115-127. A contact 59, suitably of electroplated tin-nickel-gold construction like layer 37 of FIG. 5, is deposited on the heavily n-doped GaAs 55 as a ring.

Battery 61 and resistor 62 are connected to contacts 60 and 59 to reverse bias the diode and develop a detector output voltage signal 63 in response to incoming optical communications signals impressed on the spectral combination of light rays 51, 52, 53 and 54, which are shown separated for clarity of illustration only.

The graded bandgap GaAsSbP layer 57 has a high bandgap near the heterojunction 56 and a much lower bandgap in the infrared at its interface with the GaAsSb layer 58. Thus, GaAsSb layer 58 has the smallest bandgap of all the layers. The resulting operation is that a short wavelength optical ray 51 is absorbed very near the heterojunction 56 and carriers produced by the absorption take a short time to migrate across the heterojunction 56 and produce photovoltage. A long wavelength optical ray 54 is absorbed in layer 57 far from heterojunction 56 so that photocarriers produced thereat require a much longer period of time to migrate to the junction. In this way an optical pulse which has been objectionally broadened by dispersion on its way through an optical fiber to the graded layer detector 50 of FIG. 6 can be compensated so as to substantially reduce broadening in the electrical output.

The diode 50 is particularly applicable in optical communication systems having light-emitting diodes which produce radiation over a range of wavelengths and in which the length of time required for longer wavelengths to be transmitted through an optical fiber is smaller than for shorter wavelengths. The compensation principle is more fully described in U.S. Pat. No. 3,852,591, issued Dec. 3, 1974 to T.P. Lee and T. Li.

Figure 7:
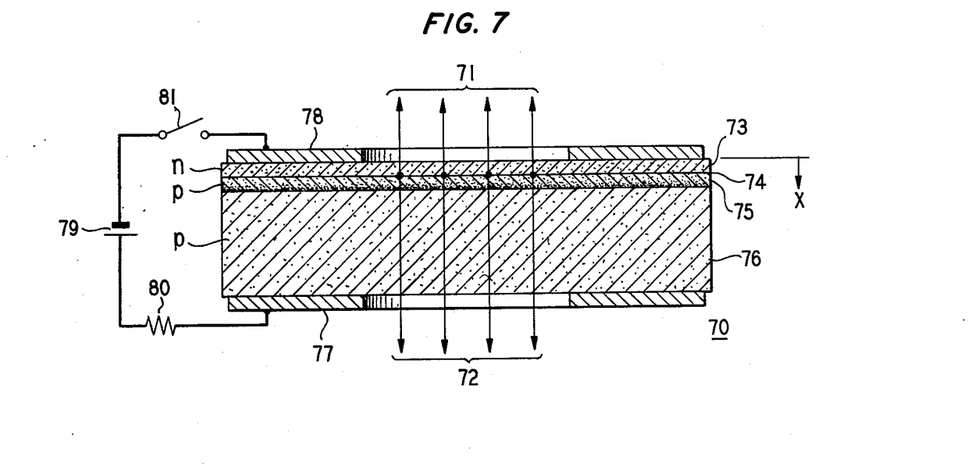
FIG. 7 shows a graded layer light-emitting diode utilizing GaAsSbP according to the invention drawn in cross section with a schematic diagram of an accompanying circuit.

The GaAsSbP system readily permits a variety of approaches to the construction of photodiodes. For instance, in another kind of p-n photodiode (see FIG. 7) a junction 74 may be located between a GaAsSbP graded layer 75 and a third layer of GaAsSb 73 as shown in FIG. 7, and described in a light-emitting diode mode below. Also, a p-n junction can be included in the GaAsSbP in two growth steps. Or the junction may be included in the GaAsSb layer 73 itself, for instance by growing two successive GaAsSb sublayers of opposite conductivity type, so that a homojunction is formed between them.

Light-emitting diodes for optical communications systems in the near-infrared are also readily fabricated from the GaAsSbP coated subassembly of the invention. FIG. 7 shows one type of GaAsSbP light-emitting diode 70, which is forward biased by battery 79 and current limitng resistor 80 when switch 81 is closed. Optical rays 71 and 72 are emitted in the near-infrared wavelength range around 1.1 micrometers. A GaAs substrate 76 is suitably doped p-type to $10^{18}$ carriers per cubic centimeter. Graded bandgap GaAsSbP layer 75 is deposited thereon to a thickness of a few micrometers and is doped p-type with germanium to a carrier concentration of about $10^{17}$–$10^{18}$ carriers per cubic centimeter. A few micrometers-thick GaAsSb layer 73 doped heavily n-type at about $10^{18}$ carriers per cubic centimeter with tellurium makes a p-n junction 74 with a GaAsSbP graded layer 75. Tin-nickel-gold ring contact 78 and platinum-gold contact 77 make ohmic contact with layer 73 and substrate 76 respectively.

Figure 8A:
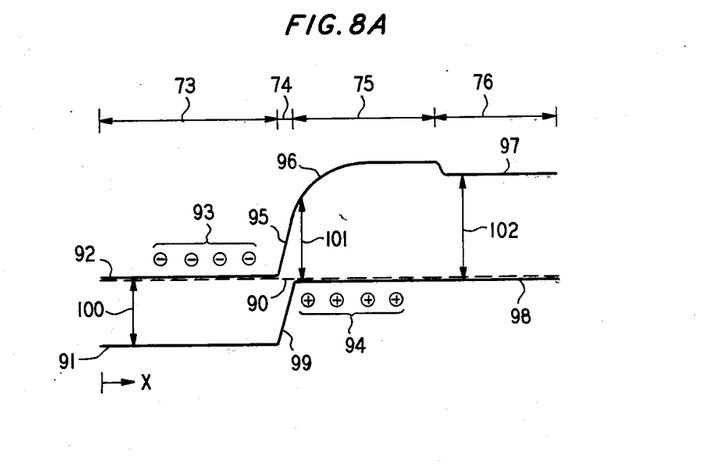
FIGS. 8A and 8B are energy band diagrams drawn versus distance $x$ into the material of the light-emitting diode of FIG. 7, the energy diagrams being useful in explaining the operation of the light-emitting diode.
Figure 8B:
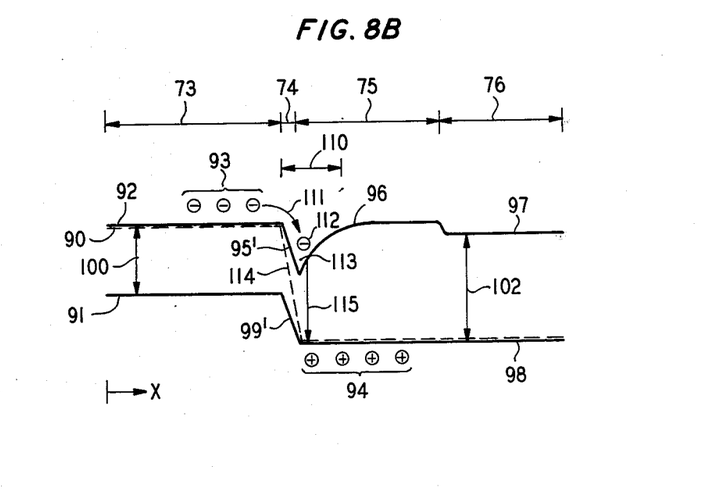

The operation of light-emitting diode 70 will be more readily understood by considering FIGS. 8A and 8B wherein an energy band diagram is drawn versus a depth dimension x of FIG. 7. The portions of FIGS. 8A and 8B corresponding to layer 73, junction 74, layer 75 and substrate 76 of FIG. 7 are indicated by zones 73, 74, 75 and 76, not necessarily drawn to scale.

FIG. 8A shows a situation in which battery 79 of FIG. 7 is disconnected by switch 81 and the light-emitting diode 70 has no applied bias. The Fermi level 90 is constant in this unbiased condition. Negative carriers 93 located in conduction band 92 of the n-type GaAsSb layer 73 are separated at junction 74 from holes 94 in the valence band 98 of the graded bandgap GaAsSbP layer 75. The valence band 91 in GaAsSb layer 73 is removed by only a small infrared energy bandgap 100 from conduction band 92. The bandgap 101 increases with increasing depth into GaAsSbP layer 75. It will be noted that the GaAs substrate 76 bandgap 102 is less than the bandgap of the GaAsSBP which lattice matches it. Conduction band 96 of layer 75 exhibits a downward jog to conduction band 97 in the GaAs layer 76 where the two layers 75 and 76 meet.

FIG. 8B shows how the energy band diagram of FIG. 8A is modified under forward bias (battery 79 of FIG. 7 connected by switch 81) so that light emission occurs. Fermi level 90 has a step 114 due to the forward bias voltage. The energy bands 95, 96, 97, 98 and 99 of FIG. 8A are displaced relative to bands 91 and 92 of GaAs Sb layer 73 by an amount related to the forward bias and are seen in FIG. 8B as bands 95', 96, 97, 98 and 99'. Because of the bias, there appears a carrier trap 113 which has steep boundaries 95' and 96 and a width 110 of approximately one carrier diffusion length. Under the influence of bias, the negative carriers 93 move in the direction 111 so that a carrier such as 112 falls into trap 113 and produces a light-emitting transition 115. The presence of the trap 113 insures that emissive transitions like transition 115 will be probable, enabling this light-emitting diode employing GaAsSbP according to the invention to be quite efficient. Transition 115 is in the near-infrared and therefore is highly suitable for use with low loss optical fibers.

Figure 9:
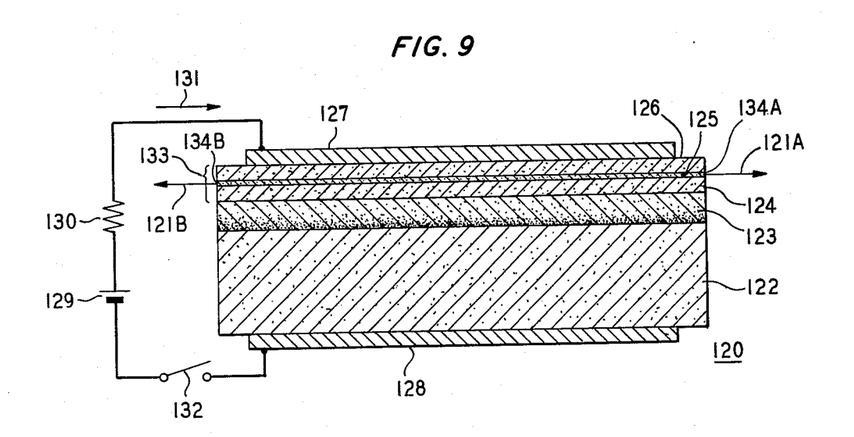
FIG. 9 shows a double heterostructure diode utilizing a lattice matching layer of GaAsSbP according to the invention drawn in cross section with a schematic diagram of an accompanying circuit.

FIG. 9 illustrates a double heterostructure diode laser 120 according to the invention. Laser 120 is forward biased by voltage sorce 129 when switch 132 is closed, the current 131 being limited by resistor 130. GaAs substrate 122 and GaAsSbP graded layer 123 grown lattice matched thereon, form a composite subassembly foundation for growth of the double heterostructure layer 133 composed of sublayers 124, 125 and 126.

GaAs layer 122 is suitably doped n-type with tin to a carier concentration of $10^{18}$ per cubic centimeter and is typically 175 micrometers thick. Graded layer 123 is 10 to 20 micrometers thick and tellurium doped n-type with a carrier concentration suitably $10^{18}$ per cubic centimeter. Double heterostructure sublayer 124 is aluminum gallium arsenide antimonide (AlGaAsSb) of approximately 2 microns thickness doped n-type with tellurium with a carrier concentration of $5 \times 10^{17}$ per cubic centimeter. Sublayer 125, typically of thickness on the order of tenths of a micrometer, is composed of GaAsSb doped with germanium to have a p-type carrier concentration of $1 \times 10^{17}$ per cubic centimeter. Sublayer 126 is composed of AlGaAsSb of thickness of approximately 2 micrometers p-doped with germanium to a carrier concentration of $5 \times 10^{17}$ per cubic centimeter. Ohmic contacts are made with tin-nickel-gold electrode layer 128 to GaAs layer 122 and with platinum-gold electrode layer 127 to AlGaAsSb sublayer 126.

Cleaved mirror edges 134A and 134B are provided at either end of the double heterostructure layer 133 so as to facilitate emission of coherent light, shown by rays 121A and 121B. The distance between the cleaved mirror edges 134A and 134B is between 100 and 1000 micrometers, suitably 500 micrometers. A suitable width of the laser (dimension into the paper) is approximately 200 micrometers, produced by a non-mirrorlike rough cut of the material.

In devices of the type shown in FIG. 9, which were grown in a manner to be described in connection with FIGS. 10 and 11, laser action at 1.0 micrometer wavelengths was obtained at room temperature under pulsed conditions with thresholds as low as 3.3kA cm$^{-2}$. These preliminary results compare satisfactorily with lasing thresholds reported for GaAsSb/AlGaAsSB double heterostructure lasers grown on step-graded multi-layer substrates as previously described by R. E. Nahory, M. A. Pollack, E. D. Beebe, J. C. DeWinter and R. W. Dixon in *Applied Physics Letters*, Volume 28, page 19, (1976). However, by way of contrast in construction, the use of continously graded GaAsSBP as a lattice matching layer simplifies the growth of double heterostructure lasers and other devices by reducing the total number of lattice matching layers required to only one.

Figure 10:
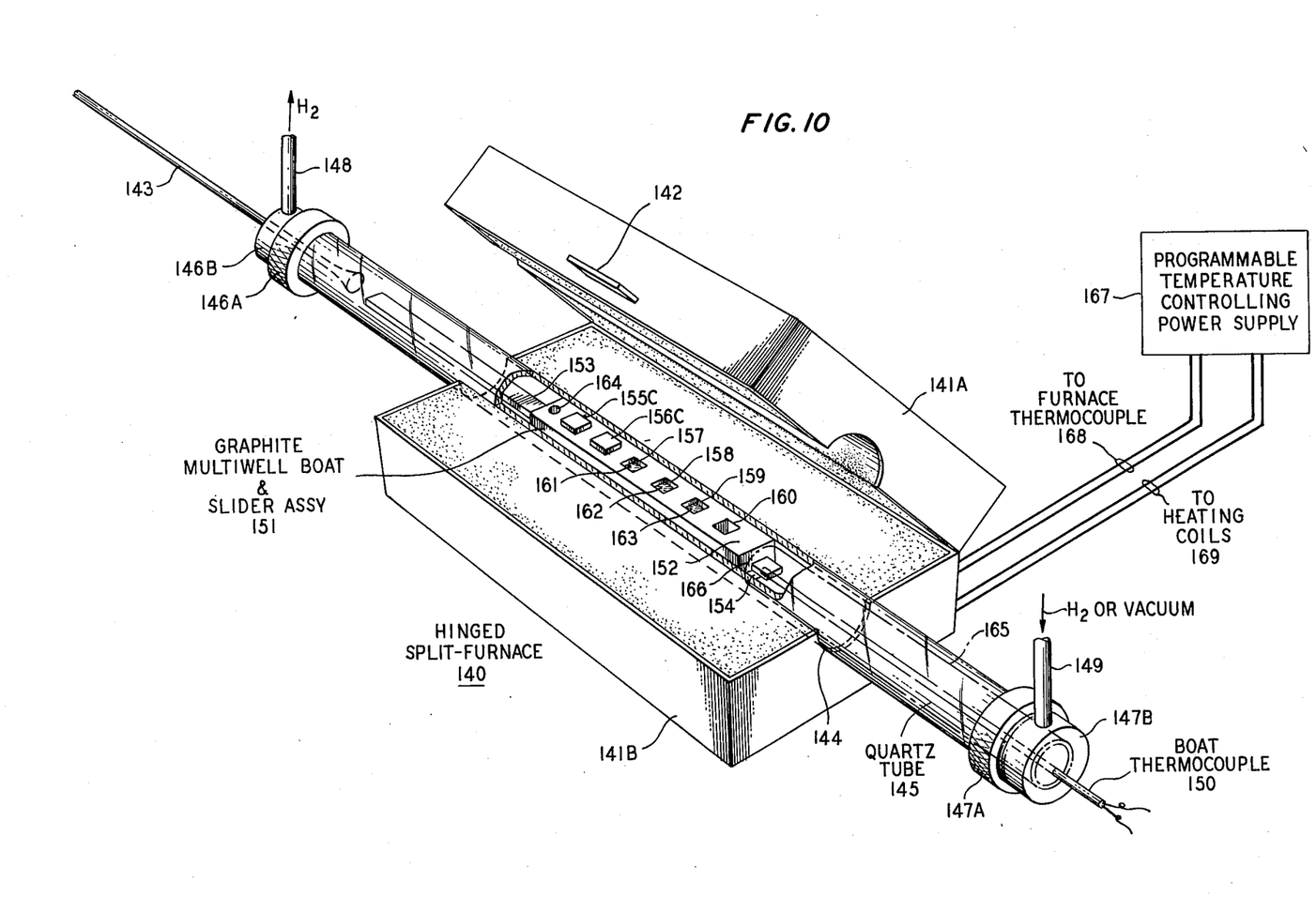
FIG. 10 is a partially block diagrammatic, partially pictorial view of apparatus for producing the coated substrate subassembly and electronic devices of the invention according to the method of the invention. A portion of the apparatus is opened and cut away to show a graphite multiwell boat and slider assembly for holding the substrate and growth solutions.
Figure 11A:
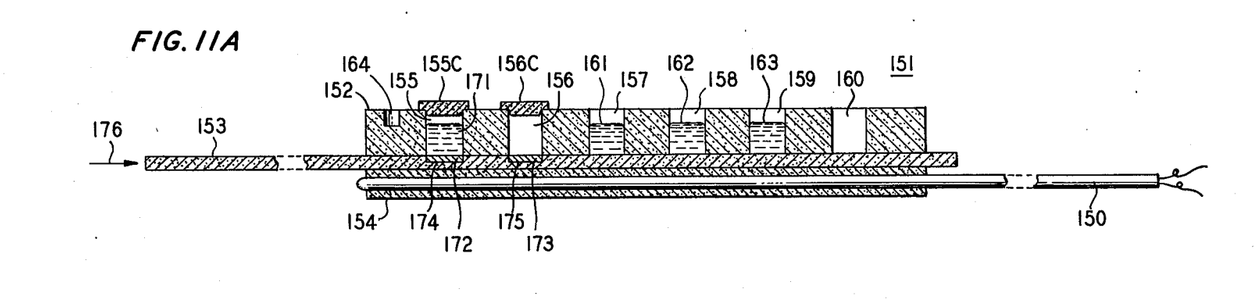
FIGS. 11A, 11B, and 11C show the multiwell boat and slider assembly of FIG. 10 in cross section at selected stages of a growth sequence for producing a double heterostructure diode of FIG. 9 according to the invention.

FIGS. 10 and 11 will serve to describe in detail a process and apparatus by which the semiconductor layers in a variety of devices according to the invention can be grown. Since FIG. 9 shows the most complex semiconductor layer and sublayer structure disclosed herein, FIGS. 10 and 11 are drawn to correspond with the specific growth process used in the construction of the laser device of FIG. 9. It should, of course, be understood that straightforward variations of the process can be used to grow semiconductor layers in less complex device structures such as those shown in FIGS. 5, 6 and 7.

In FIG. 10 a hinged split furnace 140 has cover 141A with handle 142 and channel 144 in base 141B, both the cover and base containing heating coils 169, not shown. The furnace 140 is shaped to accommodate a graphite multiwell boat and slider assembly 151 contained in a quartz tube 145 and is constructed to enable the assembly 151 to be heated to the growth temperatures required. Furnace 140 is supplied with power from a programmable power supply 167 connected by leads to the furnace heating coils 169, not shown. The temperature of the furnace is sensed by an embedded furnace thermocouple 168, not shown, connected electrically to the power supply 167. The power supply has suitable control mechanisms for setting the furnace temperature to a desired initial value and then decreasing the temperature over a period of time at a preset rate.

The multiwell boat and slider assembly 151 includes upper boat plate 152 containing wells 155 and 156, not shown, 157, 158, 159 and 160. Covers 155C and 156C are placed over wells 155 and 156 for protection purposes and phosphorus containment. Doubleheterostructure sublayer solutions 161, 162 and 163 are visible in wells 157, 158 and 159, and the GaAsSbP solution lies beneath cover 155C as well. A slider 153 is movable between upper and lower boat plates 152 and 154 and all three components of the assembly 151 are sutiably fashioned from graphite.

Assembly 151 containing the solid materials for the solutions is inserted into quartz tube 145 by means of a pushing hook, not shown, placed in hole 164. The solutions at the growth temperatures are reactive with ordinary air, so an atmosphere inert relative to the solutions is provided inside the quartz tube 145. The tube ends are closed by 0-ring seals, not shown, tightened by means of end cuffs 146A and 147A threaded onto end caps 146B and 147B respectively. Tube 145 is first evacuated and then supplied with flowing hydrogen through tube 149 and exhausted through tube 148.

A boat thermocouple 150, which is insertable in a channel in the lower boat plate 154, protrudes through tube end cap 147B via a seal, not shown. A slider push rod 143 is movable through end cap 146B through a double seal provided therein, not shown. Slider 153 is set in an initial position with the upper and lower boat plate ends resting against end 166 of an index tube 165. Index tube 165 also rests against end cap 147B so that slider 153 may readily be moved relative to the growth solutions by the action of push rod 143.

Figure 11B:
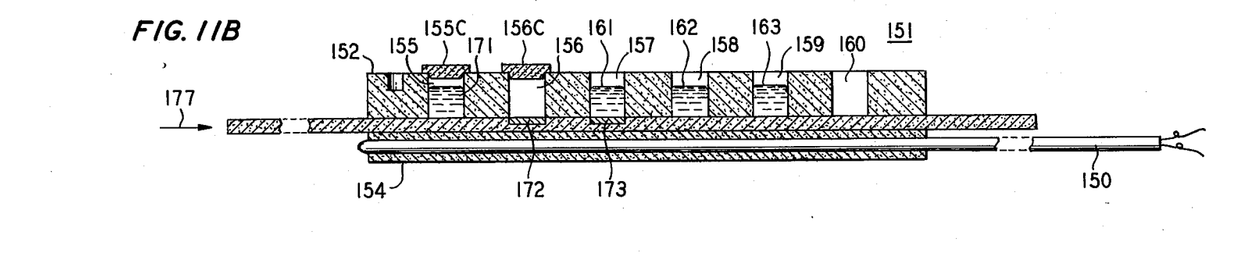
Figure 11C:
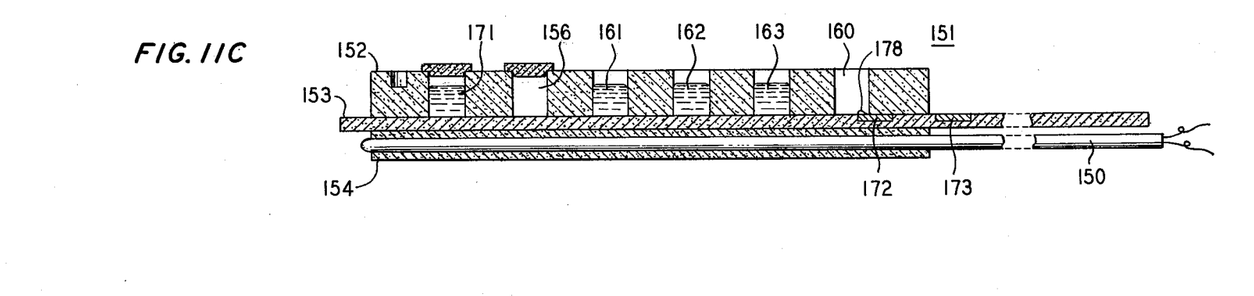

FIGS. 11A, 11B and 11C are cross sections of the multiwell boat and slider assembly 151 which will serve to better illustrate the details of a growth process employing the apparatus of FIG. 10, in the preparation of the double heterostructure laser of FIG. 9. The process proceeds as follows:

1. Prepare the (100) GaAs substrate 172 and GaAs sacrificial seed 173 by
   A. mechanically polishing each to desired thickness by rubbing on linen polishing cloth soaked with an etchant of 10 percent bromine in methanol,
   B. ultrasonically rinsing in methanol to stop the etching,
   C. ultrasonically cleaning in acetone to remove oil, D. rinsing in ethanol,
E. blowing dry with filtered nitrogen gas, and
F. placing in slider 153 recesses 174 and 175 respectively.

This preparation method produces a clean, smooth surface upon which GaAsSbP growth has been demonstrated, but other methods which can produce an even smoother surface may be unsuitable for enabling the GaAsSbP to adhere. Any method which produces a prepared substrate surface like the preparation above is suitable, of course.

2. Weigh out according to Table III six nines pure Ga to ±0.000001 grams (six places), six nines pure Sb to ±0.0001 grams (four places), five nines pure GaAs to ±0.0001 grams (four places), five nines pure GaP to ±0.000001 grams (six places), and five nines pure aluminum, tellurium, and germanium to ±0.000005 grams (5 places ± ½ place). The tabulated weight ratios result in excess GaAs for solution 171 in well 155 so as to saturate the solution with arsenic. The growth solution 171 itself includes gallium, arsenic, antimony, and phosphorus in proportions such that the grown coating of GaAsSbP will substantially lattice match the substrate.

TABLE III

| | (Use of weight ratios requires determination of Ga weight to six places.) | | | | | Dopants | |
|---|---|---|---|---|---|---|---|
| Well No. | Approx. Wt. Ga | GaAs/Ga | Sb/Ga | GaP/Ga | Al/Ga | Te/Ga | Ge/Ga |
| 155 | 0.46g | 0.075 | 1.07508 | $(810\pm1)\times10^{-6}$ | — | 0.0005 | — |
| 157 | 0.63g | 0.060 | 1.07508 | — | 0.0025 | 0.0005 | — |
| 158 | 0.64g | 0.060 | 1.0740 | — | — | — | 0.0002 |
| 159 | 0.66g | 0.060 | 1.07329 | — | 0.0025 | — | 0.00235 |

3. Insert slider 153 between upper and lower boat plates 152 and 154 so that substrate 172 and seed 173 are covered by upper boat plate 152 and straddle well 155 so that the sacrificial seed will not subsequently contact solution 171. Load wells 155, 157, 158 and 159 with only the gallium and antimony ingredients from Table III, and do not use any covers 155C and 156C. Insert multiwell boat and slider assembly 151 in quartz tube 145 of FIG. 10, flow hydrogen gas while maintaining one-third pound head pressure therein, and bake (suitably overnight - 16 hours) at approximately 825°C.

4. After baking, remove tube 145 from furnace 140, and allow to cool until thermocouple 150 reads 50°C or less. Flow filtered nitrogen at same one-third pound head pressure for at least five minutes to flush out flammable hydrogen. Remove boat assembly 151 from tube 145. Load remaining ingredients to complete the solid charges for the solutions 171, 161, 162, and 163 including solution 171 having gallium arsenic, antimony, and phosphorus constituents. Put covers 155C and 156C on wells 155 and 156.

5. Reinsert boat assembly 151 in tube 145. Evacuate tube for 10 minutes at room temperature to a pressure of less than five microns of mercury and then flow hydrogen gas through tube 145 at one-third pound head pressure inside tube, for at least one-half hor before replacing in furnace.

6. Bake assembly 151 for one hour at 825°C. In this manner the solid charges are heated so that growth solutions are formed. In particular, growth solution 171 having gallium, arsenic, antimony, and phosphorus constituents is formed. At the same time GaAs substrate 172 is heated to a temperature comparable to the solution temperature preliminary to application of solution 171 thereto. Manually drop furnace temperature 3°C and initiate a programmed temperature rundown at less than about 2°C per minute rate of decrease, 0.5° to 1.0°C being quite suitable and 0.6° rate being used for illustration.

7. When the programmed temperature reaches 820°C, push slider 153 of FIG. 11A in the direction of arrow 176 so that growth substrate 172 in recess 174 of slider 153 rests beneath GaAsSbP growth solution 171, which thereby is applied in temperature lowering liquid phase epitaxy. The wells are suitably 0.375 inches deep and 0.350 inches by 0.300 inches) in cross section for holding the solutions. At this time sacrificial seed 173 is stored in recess 175 beneath empty well 156. Cover 156C protects sacrificial seed 173 from direct radiation from the heating coils of the furnace, and cover 155C prevents excessive evaporation of phosphorus from growth solution 171.

8. Continue programmed rundown at the temperature decrease rate suitably of 0.6°C per minute through a temperature drop of 30°C. The GaAsSbP graded layer 123 of FIG. 9 grows substantially lattice matched on substrate 172 of FIG. 11A. Thermocouple 150 in a channel in lower boat plate 154 placed between wells 157 and 158 provides measurements from a point adjacent to the growth solutions. 9. Push slider 153 in the direction of arrow 177 of FIG. 11B so that sacrificial seed 173 contacts solution 161 in well 157. Substrate 172 with the grown GaAsSbP coating layer is held in reserve in well 156 and protected from direct furnace radiation by graphite cover 156C. The temperature drop is continued for another 2° C. during this time. 10. Push slider 153 again in the direction of arrow 177 so that substrate 172 lies beneath the AlGaAsSb growth solution 161. Temperature is decreased 5° C. at the programmed rate resulting in formation of AlGaAsSb sublayer 124 of FIG. 9. In the meantime, sacrificial seed 173 is equilibrating with solution 162 in well 158. 11. Move substrate 172 in the direction of arrow 177 beneath solution 162 to remain through a temperature drop of 0.3° C. so that sublayer 125 of GaAsSb of FIG. 9 grows thereon. In the meantime sacrificial seed 173 is equilibrating with growth solution 163 in well 159. 12. Move substrate 172 in the direction of arrow 177 to a position beneath growth solution 163 in well 159. The temperature continues to drop at the programmed rate through 6° C. resulting in the formation of AlGaAsSb sublayer 126 of FIG. 9. The sacrificial seed 173, no longer being needed, rests in empty well 160 during this step. 13. Move slider 153 in the direction of arrow 177 to a position such that both substrate 172 and sacrificial seed 173 exit from beneath upper boat plate 152. Substrate 172 with grown layers as in FIG. 9 passes beneath empty well 160 during motion in such a manner that any remaining small droplet of growth solution 178 is wiped therefrom by a lower edge of empty well 160 according to FIG. 11C. 14. Remove quartz tube 145 of FIG. 10 containing the multiwell boat and slider assembly 151 from the furnace 140 and cool below 50° C. Flush with filtered nitrogen for at least five minutes to remove hydrogen. Remove the substrate 172 of FIG. 11C with the grown layer 123, and sublayers 124, 125 and 126 of FIG. 9 from slider 153 and apply electrodes 127 and 128.

Step 14 completes the description of a method of liquid phase epitaxial growth of a GaAsSbP semiconductor laser according to the invention.

The art of liquid phase epitaxy encompasses a wide variety of methods, of course, and the description of specific methods such as are applied in the temperature lowering approach hereinabove serves purposes of illustration rather than limitation. For instance, the tipping technique of liquid phase epitaxy in which the growth solution is flooded over the substrate at the initiation of growth is a satisfactory alternative method for growing GaAsSbP coatings on substrates. For an introduction to the technique in general see, for instance, U.S. Pat. No. 3,560,275 issued Feb. 2, 1971 to H. Kressel et al. The solution container, or boat, may be suitably covered or sealed to substantially reduce or eliminate loss of phosphorus by evaporation when GaAsSbP is grown. Conversely if rapid grading of phosphorus is desired, a cover may be provided with a controlled leak or removed at any appropriate time to permit evaporation.

Methods of liquid phase epitaxy utilizing dipping of the substrate in the solution are likewise applicable. Thermal gradient transport techniques may be used to deposit the GaAsSbP on the substrate in liquid phase epitaxy, using apparatus like that of U.S. Pat. No. 3,785,885 issued Jan. 15, 1974 to L. E. Stone.

The invention also contemplates production of a myriad of useful devices having substrates on which layers and structures of GaAsSbP or even more complex solid solutions such as AlGaAsSbP are grown by any suitable crystal growth method. Various substrates, including substrates involving metals, insulators, or crystalline materials of a variety of types may find utility in devices of the invention. Mixed processes of vapor phase epitaxy and liquid phase epitaxy may also be adapted for fabrication of subassemblies and devices according to the invention, in a manner related to the teachings of U.S. Pat. No. 3,802,967 issued Apr. 9, 1974 to I. Ladany et al., for instance.

Thus, the description hereinabove of particular subassemblies, devices, structures, processes, or method embodiments of the invention are meant to suggest and illustrate the invention itself, but equivalents of these embodiments and other devices, processes, or methods and equivalents thereof are, of course, comprehended in the true spirit and scope of the invention by applications of its principles. In all cases the invention is to be recognized as it is defined in the appended claims.

What is claimed is:

1. In a process for coating a Group III-Group V substrate the steps comprising heating a solid having gallium, arsenic, antimony and phosphorus constituents so that a growth solution having a solution temperature is formed;

heating said substrate to a temperature comparable to said solution temperature; and applying said growth solution to said substrate by a liquid phase epitaxial method so that a grown coating results, said solution including gallium, arsenic, antimony and phosphorus in proportions such that the grown coating is substantially lattice matched to said substrate, whereby said grown coating is found to be graded in phosphorus content and to have a smooth surface having a lattice constant significantly different from said substrate so that growth of subsequent layers in electronic device manufacture is facilitated.

2. In a method for liquid phase epitaxial growth of a coating on a substrate having a lattice constant the steps comprising covering said substrate with a liquid solution comprising gallium, arsenic, antimony, and phosphorus at a temperature and composition such that the solution is in substantial equilibrium with a corresponding solid which substantially lattice matches said substrate and decreasing said temperature, whereby a coating layer grows lattice matched on said substrate in suitable manner for electronic device manufacture.

3. The method of claim 2 wherein said temperature lies between about 700° C. and about 950° C. and the rate of temperature decrease is less than about 2° C. per minute.

4. The method of claim 2 wherein said temperature lies between 775° C. and 825° C.

5. The method of claim 2 wherein said solution is substantially entirely composed of gallium, arsenic, antimony and phosphorus and said substrate is gallium arsenide, whereby at least part of said coating layer is formed of gallium arsenide antimonide phosphide (GaAsSbP).

6. The method of claim 5 in which said temperature is decreased for enough time so that a layer of gallium arsenide antimonide (GaAsSb) is produced upon said GaAsSbP layer part, whereby lattice matched infrared devices may be conveniently produced.

7. The method of claim 2 for liquid phase epitaxial growth of a coating of GaAsSbP on a GaAs substrate wherein said solution has
an atom fraction of gallium of about 0.61,
an atom fraction of arsenic of about 0.02,
an atom fraction of antimony of about 0.37, and
an atom fraction of phosphorus of about 0.00034; and
said temperature is approximately 825° Centigrade, whereby a lattice matched graded layer of GaAsSbP grows on said GaAs substrate.

* * * * *